(12) United States Patent
Srinivasan et al.

(10) Patent No.: US 10,546,082 B1
(45) Date of Patent: Jan. 28, 2020

(54) RESISTOR NETWORK REDUCTION FOR FULL-CHIP SIMULATION OF CURRENT DENSITY

(71) Applicant: Mentor Graphics Corporation, Wilsonville, OR (US)

(72) Inventors: Sridhar Srinivasan, Tualatin, OR (US); Armen Asatryan, Fremont, CA (US); Patrick Gibson, Tualatin, OR (US); Grigor Geoletsyan, Yerevan (AM)

(73) Assignee: Mentor Graphics Corporation, Wilsonville, OR (US)

( * ) Notice: Subject to any disclaimer, the term of this patent is extended or adjusted under 35 U.S.C. 154(b) by 87 days.

(21) Appl. No.: 15/873,882

(22) Filed: Jan. 17, 2018

(51) Int. Cl.
*G06F 17/50* (2006.01)

(52) U.S. Cl.
CPC ...... *G06F 17/5036* (2013.01); *G06F 17/5022* (2013.01); *G06F 17/5045* (2013.01)

(58) Field of Classification Search
CPC ............. G06F 17/5022; G06F 17/5036; G06F 17/5054
USPC .................................................. 716/100, 106
See application file for complete search history.

(56) References Cited

U.S. PATENT DOCUMENTS

| | | | | |
|---|---|---|---|---|
| 5,440,512 | A * | 8/1995 | Harinna et al. ...... | G11C 7/1051 365/189.09 |
| 6,212,492 | B1 * | 4/2001 | Kuge ................. | G06F 17/5022 703/15 |
| 8,072,189 | B2 * | 12/2011 | Sakurai et al. ....... | H02J 7/0034 320/134 |
| 8,633,680 | B2 * | 1/2014 | Zhao et al. ............. | H02M 3/00 323/266 |
| 8,850,375 | B2 * | 9/2014 | Zou et al. ........... | G06F 17/5036 716/110 |

OTHER PUBLICATIONS

P. Tong, et al., "HBM Failure Diagnosis on a High-Frequency Analog Design With Full-Chip Dynamic ESD Simulation", 2014 EOS/ESD Symposium, Published in: Electrical Overstress/ Electrostatic Discharge Symposium (EOS/ESD), 2014 36th.
S. Poon, et al., "A Full-Chip ESD Simulation Flow", Conference date Sep. 27-Oct. 2, 2015, added to IEEE Xplore, Nov. 2, 2015, Published in: Electrical Overstress/Electrostatic Discharge Symposium (EOS/ESD), 2015 37th.

* cited by examiner

*Primary Examiner* — Sun J Lin

(57) ABSTRACT

Aspects of technology disclosed herein relate to techniques of a full-circuit simulation-based circuit design verification. A simulation is performed to determine current data of parasitic resistors in one or more parasitic resistance networks in power supply circuitry of a circuit design by injecting a current into each one of the one or more parasitic resistance networks. Based on the current data, non-current carrying parasitic resistors are removed from the one or more parasitic resistance network to generate one or more reduced parasitic resistance network. Using the one or more reduced parasitic resistance networks, a full-circuit simulation is performed to obtain current density information. A circuit design verification of the circuit design is then performed based on the current density information.

15 Claims, 5 Drawing Sheets

Flow chart 400

410: Performing simulation to determine current data of parasitic resistors in one or more parasitic resistance networks in power supply circuitry of a circuit design by injecting current into each of the one or more parasitic resistance networks

420: Determining one or more reduced parasitic resistance network for the one or more parasitic resistance networks by removing non-current carrying parasitic resistors from the one or more parasitic resistance networks

430: Performing full-circuit simulation using the one or more reduced parasitic resistance networks to obtain current density information

440: Performing circuit design verification based on the current density information

450: Reporting results of the circuit design verification

Flow chart
400

FIG. 4

RESISTOR NETWORK REDUCTION FOR FULL-CHIP SIMULATION OF CURRENT DENSITY

FIELD OF THE DISCLOSED TECHNOLOGY

The present disclosed technology relates to the field of circuit design verification. Various implementations of the disclosed technology may be particularly useful for full-chip simulation of current density.

BACKGROUND OF THE DISCLOSED TECHNOLOGY

Electrostatic charge is defined as "electric charge at rest". Static electricity is an imbalance of electrical charges within or on the surface of a material. This imbalance of electrons produces an electric field that can be measured and that can influence other objects. Electrostatic discharge (ESD) is defined as the rapid, spontaneous transfer of electrostatic charge induced by a high electrostatic field. Electrostatic discharge can change the electrical characteristics of a semiconductor device, degrading or destroying it. With both the need for increased performance (devices that operate at 1 GHz and higher and high speed serial link input/outputs that operate at 20-30 gigabit per second) and the increase in the density of circuits (Moore's Law) on a device, integrated circuits are expected to become more sensitive to ESD events. This trend may be accelerating.

An ESD event will force a current pulse from few hundred milliamps to several tens of amps into the integrated circuit for a time period ranging from few nanoseconds to several microseconds. Typical power levels that need to be dissipated during an ESD event are on the order of several tens of watts. An ESD protection circuit can be used to shunt the ESD current through the unpowered IC along the intended ESD protection path, while clamping the voltage at a safe level, without causing any IC functional performance degradation. An ESD protection mechanism should therefore have the ability to protect the circuit and the components to which it is connected. This may include a fast turn-on of ESD protection device, which minimizes the voltage clamping level, and shunts ESD energy away from the protected circuit area.

To ensure a robust ESD protection design, ESD protection evaluation and verification needs to be done at every stage of an overall integrated circuit design flow. Today's electronic design automation tool landscape offers a wide range of options for rule-based ESD verification. Designers may identify the protection schemes, write a pattern template for each protection scheme as an input for a verification tool and run the verification tool to automatically identify whether these patterns are present on all input/output pads in a design.

As technology scaling continues, meeting product ESD targets becomes more challenging. At 14 nm and below, for example, the physical area taken by ESD protection devices often appear to be getting bigger compared to the rapidly shrinking logic devices. This puts pressure on making sure the protection devices are sized just right to meet ESD performance without excessive margin. Another example is that the interconnect stack tends to favor more thin metal layers, which can increase the interconnect resistance to a level unseen in earlier technology nodes. Under such conditions, a rule-based ESD verification approach is not sufficient. A full-circuit (full-chip) simulation-based approach can provide a more accurate and comprehensive analysis.

A full-circuit current density simulation faces many challenges given the large sizes of modern IC designs. Parasitic extraction can generate a vast amount of data for the power, ground and pad nodes. The peak memory usage during simulation can make the full-circuit simulation-based analysis impractical. A reduction of parasitic resistance data needed for simulation without severely affecting accuracy is desirable.

BRIEF SUMMARY OF THE DISCLOSED TECHNOLOGY

Aspects of the disclosed technology relate to techniques of full-circuit simulation-based circuit design verification. In one aspect, there is a method comprising: performing simulation to determine current data of parasitic resistors in one or more parasitic resistance networks in power supply circuitry of a circuit design by injecting current into each of the one or more parasitic resistance networks, the current being injected at one or more current source nodes and being drained at one or more current drain nodes, the one or more current source nodes and the one or more current drain nodes being selected from nodes of the power supply circuitry that are connected to the each of the one or more parasitic resistance networks, the nodes of the power supply circuitry comprising pins of circuit devices in or connected to the power supply circuitry, power supply pads (power/ground), or both; determining one or more reduced parasitic resistance network for the one or more parasitic resistance networks by removing non-current carrying parasitic resistors from the one or more parasitic resistance networks, the non-current carrying parasitic resistors being determined based on the current data and a predetermined threshold current value; performing full-circuit simulation using the one or more reduced parasitic resistance networks to obtain current density information; performing circuit design verification of the circuit design based on the current density information; and reporting results of the circuit design verification.

The circuit devices in the power supply circuitry may comprise a voltage divider, an ESD (electrostatic discharge) protection device, or both. The circuit design verification may comprise ESD (electrostatic discharge) protection checks, electromigration checks, or both.

The injected current may be between two and five times of an amount current which the power supply circuitry is designed for. The predetermined threshold current value may be on the order of $10^{-5}$ Ampere.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages

BRIEF DESCRIPTION OF THE DRAWINGS

FIG. 4 illustrates a flowchart showing a process for full-circuit simulation-based circuit design verification that may be implemented according to various examples of the disclosed technology.

DETAILED DESCRIPTION OF THE DISCLOSED TECHNOLOGY

General Considerations

Figure 1:
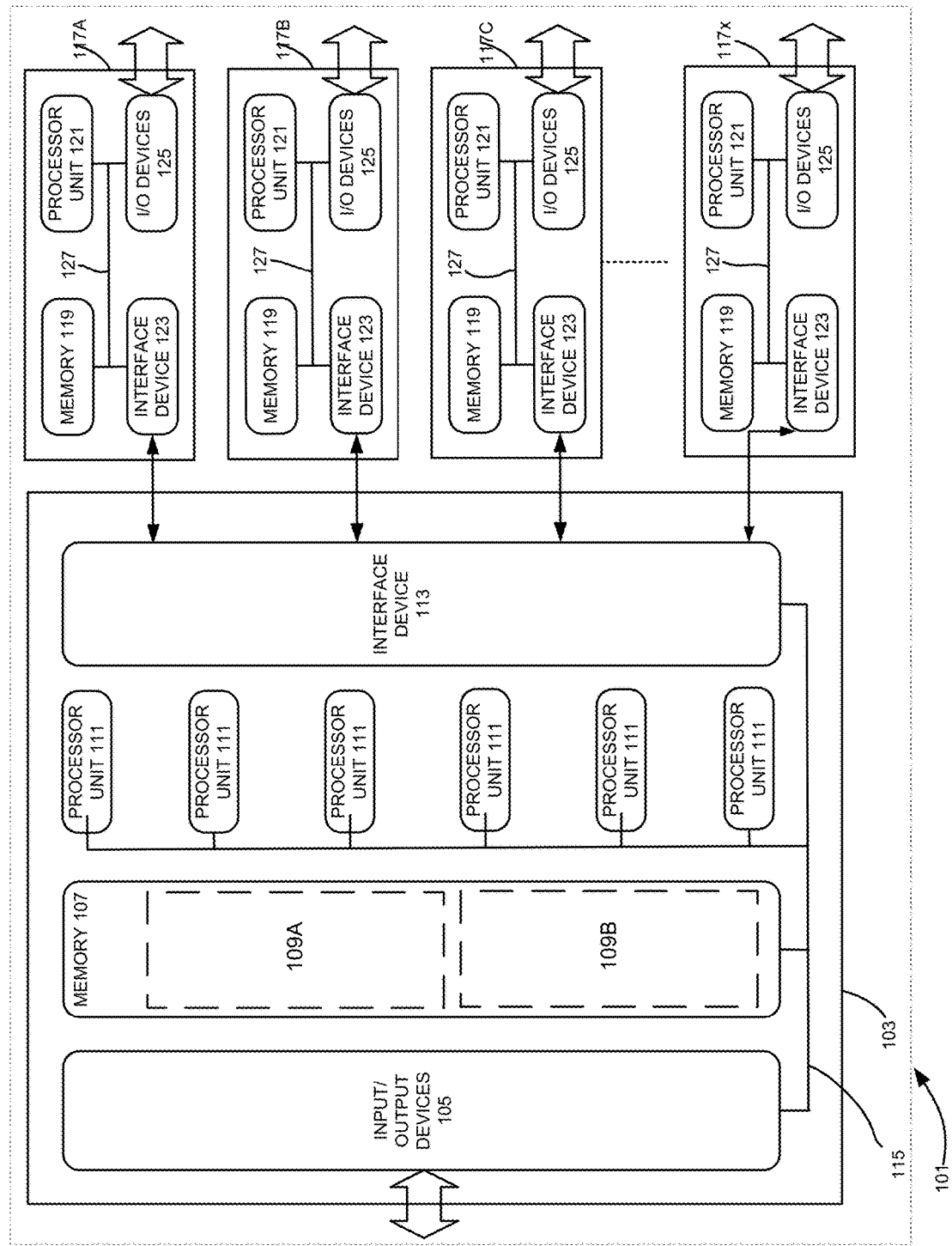
FIG. 1 illustrates an example of a computing system that may be used to implement various embodiments of the disclosed technology.

Various aspects of the present disclosed technology relate to techniques of full-circuit simulation-based circuit design verification. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "determine" and "report" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
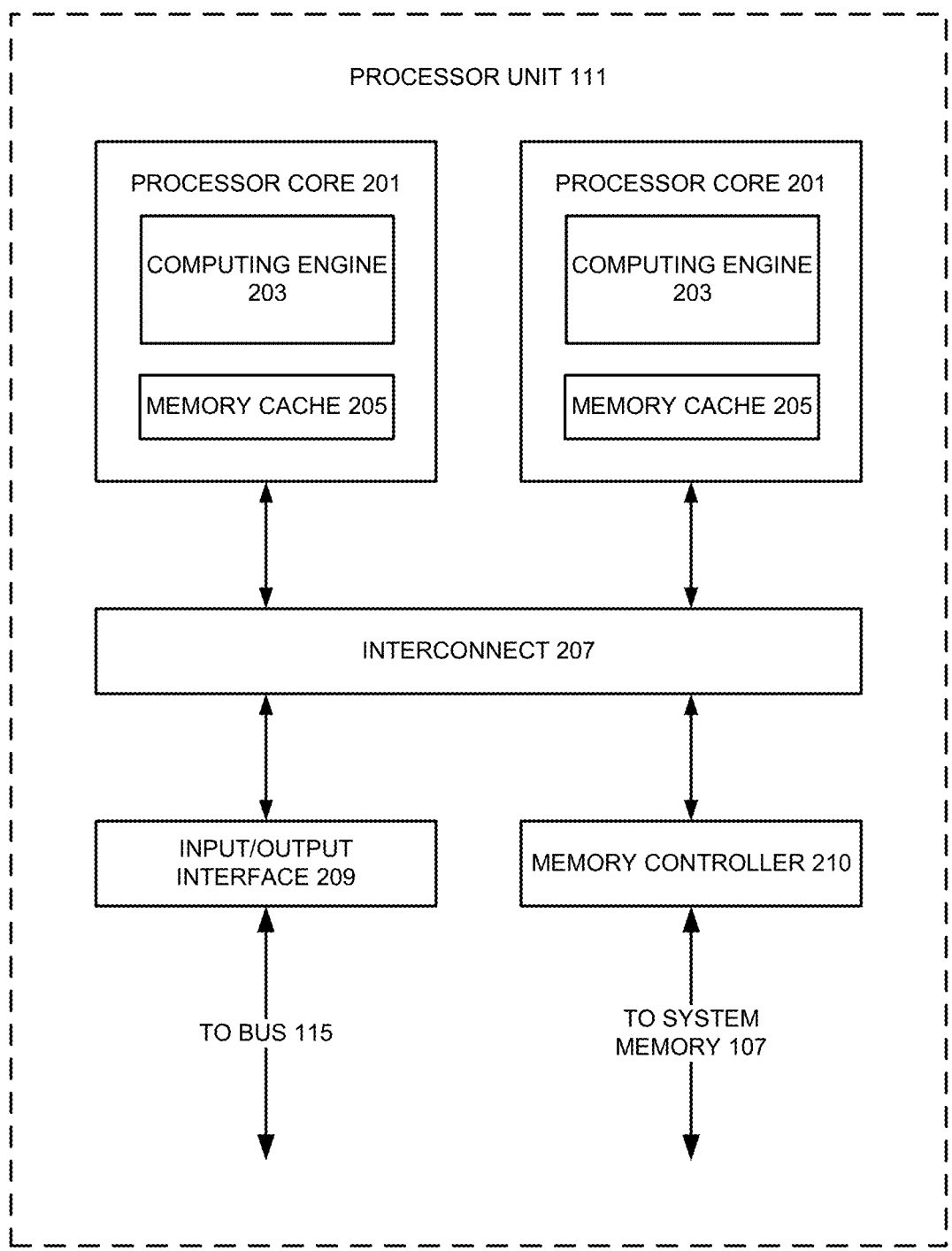
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Design Flow and Reliability Verification

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Process variations and technical limitations of the lithography techniques can make it difficult or even impossible to print some layout features. To achieve a high overall yield and reliability for the design, the layout is measured by a set of geometric constraints, or design rules, specific to a particular lithographic process before tapeout. Design rule checking is thus a major step during physical verification signoff on the design. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes (e.g., optical proximity correction), that modify the layout design data to improve the usable resolution of the reticle or mask created from the design in a photolithographic manufacturing process.

Circuit designs and layout designs are also reviewed for reliability issues caused by the electrical system. This is sometimes referred to as reliability verification. Reliability verification can include reviewing the design for protection from electrostatic discharge (ESD) events, detecting electrical overstress (EOS) situations, performing voltage-aware design rule checking (VDRC), or the like.

Circuit Design Verification Tool

Figure 3:
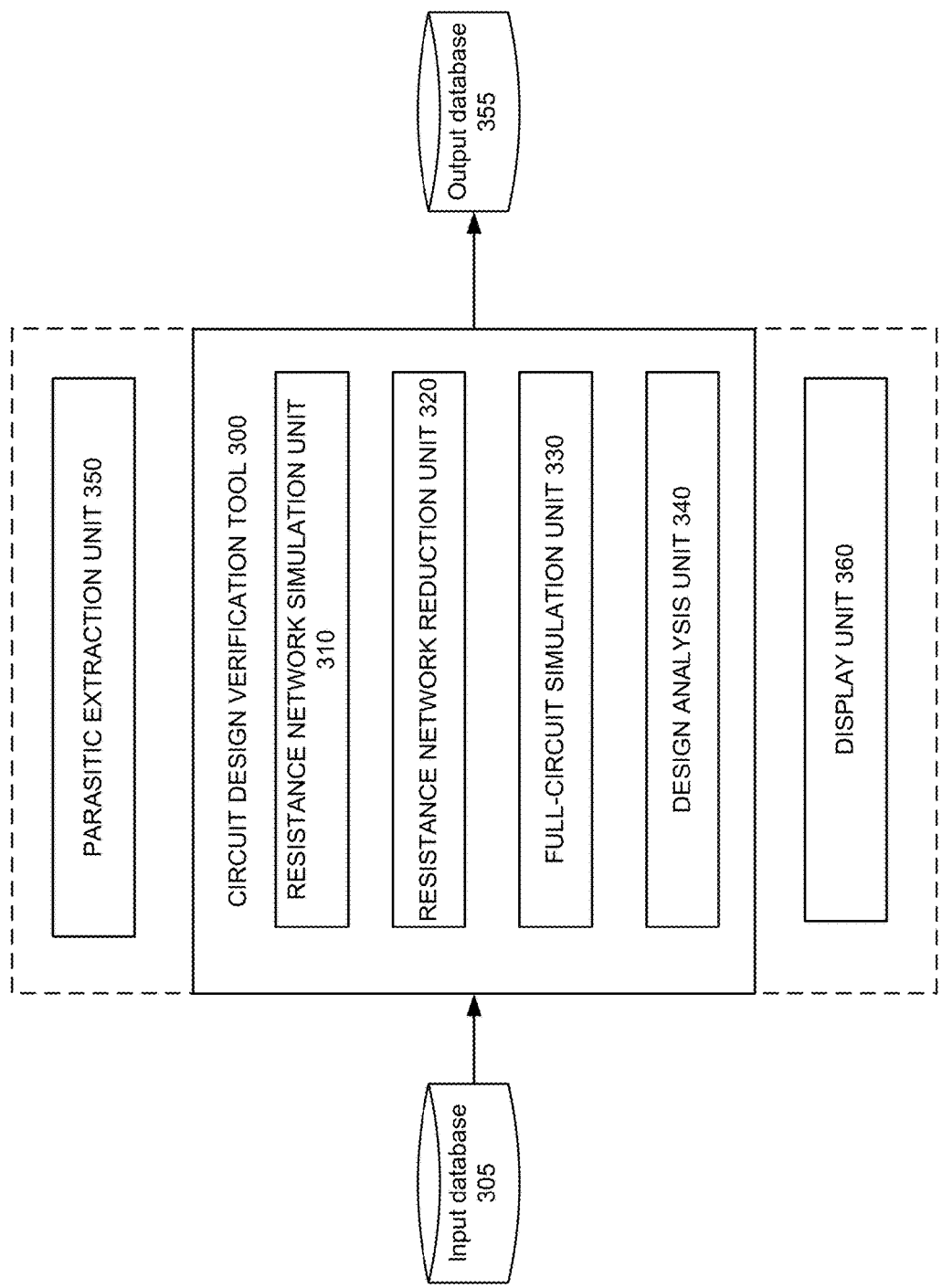
FIG. 3 illustrates an example of a circuit design verification tool according to various embodiments of the disclosed technology.

FIG. 3 illustrates an example of a circuit design verification tool 300 that may be implemented according to various embodiments of the disclosed technology. As seen in this figure, the circuit design verification tool 300 includes a resistance network simulation unit 310, a resistance network reduction unit 320, a full-circuit simulation unit 330 and a design analysis unit 340. Some implementations of the circuit design verification tool 300 may cooperate with (or incorporate) one or more of a parasitic extraction unit 350, a graph unit 360, an input database 305 and an output database 355.

As will be discussed in more detail below, the circuit design verification tool 300 can receive a circuit design from the input database 305. The circuit design comprises one or more parasitic resistance networks in power supply circuitry. The one or more parasitic resistance networks may be derived by the parasitic extraction unit 340. The resistance network simulation unit 310 performs simulation to determine current data of parasitic resistors in the one or more parasitic resistance networks by injecting current into each of the one or more parasitic resistance networks. The current is injected at one or more current source nodes and is drained at one or more current drain nodes. The one or more current source nodes and the one or more current drain nodes are selected from nodes of the power supply circuitry that are connected to the each of the one or more parasitic resistance networks. The nodes of the power supply circuitry comprise pins of circuit devices in the power supply circuitry, power supply pads (power/ground), or both. The resistance network reduction unit 320 determines one or more reduced parasitic resistance network for the one or more parasitic resistance networks by removing non-current carrying parasitic resistors from the one or more parasitic resistance networks. The non-current carrying parasitic resistors are determined based on the current data and a predetermined threshold current value. The full-circuit simulation unit 330 performs full-circuit simulation using the one or more reduced parasitic resistance networks to determine current density information. The design analysis unit 340 performs a circuit design verification process based on the current density information. The circuit design verification tool 300 reports results of the circuit design verification. The reporting may comprise storing in the output database 355 and/or displaying by the graph unit 360.

As previously noted, various examples of the disclosed technology may be implemented by one or more computing systems, such as the computing system illustrated in FIGS. 1 and 2. Accordingly, one or more of the resistance network simulation unit 310, the resistance network reduction unit 320, the full-circuit simulation unit 330, the design analysis unit 340, and the parasitic extraction unit 350 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the resistance network simulation unit 310, the resistance network reduction unit 320, the full-circuit simulation unit 330, the design analysis unit 340, and the parasitic extraction unit 350. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the resistance network simulation unit 310, the resistance network reduction unit 320, the full-circuit simulation unit 330, the design analysis unit 340, the parasitic extraction unit 350 and the graph unit 360 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Full-Chip Simulation Based on Resistor Network Reduction

FIG. 4 illustrates a flowchart 400 showing a process of full-circuit simulation-based circuit design verification that may be implemented according to various examples of the disclosed technology. For ease of understanding, methods of full-circuit simulation-based circuit design verification that may be employed according to various embodiments of the disclosed technology will be described with reference to the circuit design verification tool 300 in FIG. 3 and the flow chart 400 illustrated in FIG. 4. It should be appreciated, however, that alternate implementations of a circuit design verification tool may be used to perform the methods of full-circuit simulation-based circuit design verification illustrated by the flow chart 400 according to various embodiments of the disclosed technology. Likewise, the circuit design verification tool 300 may be employed to perform other methods of full-circuit simulation-based circuit design verification according to various embodiments of the disclosed technology.

In operation 410, the resistance network simulation unit 310 performs simulation to determine current data of parasitic resistors in one or more parasitic resistance networks in power supply circuitry of a circuit design. The circuit design may comprise a logic circuit design such as a netlist and a physical layout design. The netlist may be derived from the layout design. Alternatively, the netlist may be derived from a schematic design. The cross-reference information between logic identifiers and layout features may be generated according to methods disclosed in U.S. patent application Ser. No. 13/017,788 (U.S. Publication Number US2011-0320990A1), which is incorporated herein by reference.

The power supply circuitry comprises conducting elements connecting to a power supply source or ground. The nodes of the power supply circuitry comprise pins of circuit devices in or connected to the power supply circuitry, power supply pads (power/ground), or both. The circuit devices in or connected to the power supply circuitry comprise voltage dividers, ESD protection devices, or any combination thereof.

The conducting elements in the power supply circuitry comprise metal wires and may further comprise vias that connecting different layers of a chip. The materials of the conducting elements are not perfect conductors. The manufacturing process can also introduce resistance. The parasitic resistance can influence performance of a circuit design. A circuit verification process thus typically includes parasitic extraction. The parasitic extraction typically analyzes layout designs to derive geometric information and convert it to parasitic element values based on calibrated data supplied by a semiconductor manufacturer. The parasitic extraction unit 350 may be employed to derive the one or more parasitic resistance networks in the power supply circuitry. The parasitic extraction unit 350 may be implemented by various parasitic extraction tools such as those in the Calibre family of software tools available from Mentor Graphics Corporation, Wilsonville, Oreg.

For the circuit design, the extracted parasitic resistors associated with the power supply circuitry can form at least two parasitic resistance networks, one for the power supply part and the other for the ground part. The circuit design may have multiple power domains. In each of the power domain, there may be at least two parasitic resistance network. Today's large design can have multiple power domains. Each of the parasitic resistance network can have many parasitic resistors. A full-chip simulation to determine current densities may not be practical due to the computing resource (e.g., memory) requirement. To help reduce the number parasitic resistors that need to be considered during the full-chip simulation, by the resistance network simulation unit 310 performs the simulation to determine the current data of parasitic resistors.

The simulation comprises injecting current into each of the one or more parasitic resistance networks. The current is injected at one or more of nodes of the power supply circuitry that are connected to the each of the one or more parasitic resistance networks (current source nodes) and is drained at one or more of the nodes of the power supply circuitry (current drain nodes). The nodes of the power supply circuitry comprises pins of circuit devices in or connected to the power supply circuitry, power supply pads (power/ground), or both. The current source node may be a power supply pad, or a pin of an ESD (electrostatic discharge) protection device. According to some embodiments of the disclosed technology, the injected current is between two and five times of an amount current which the power supply circuitry is designed for.

Figure 5:
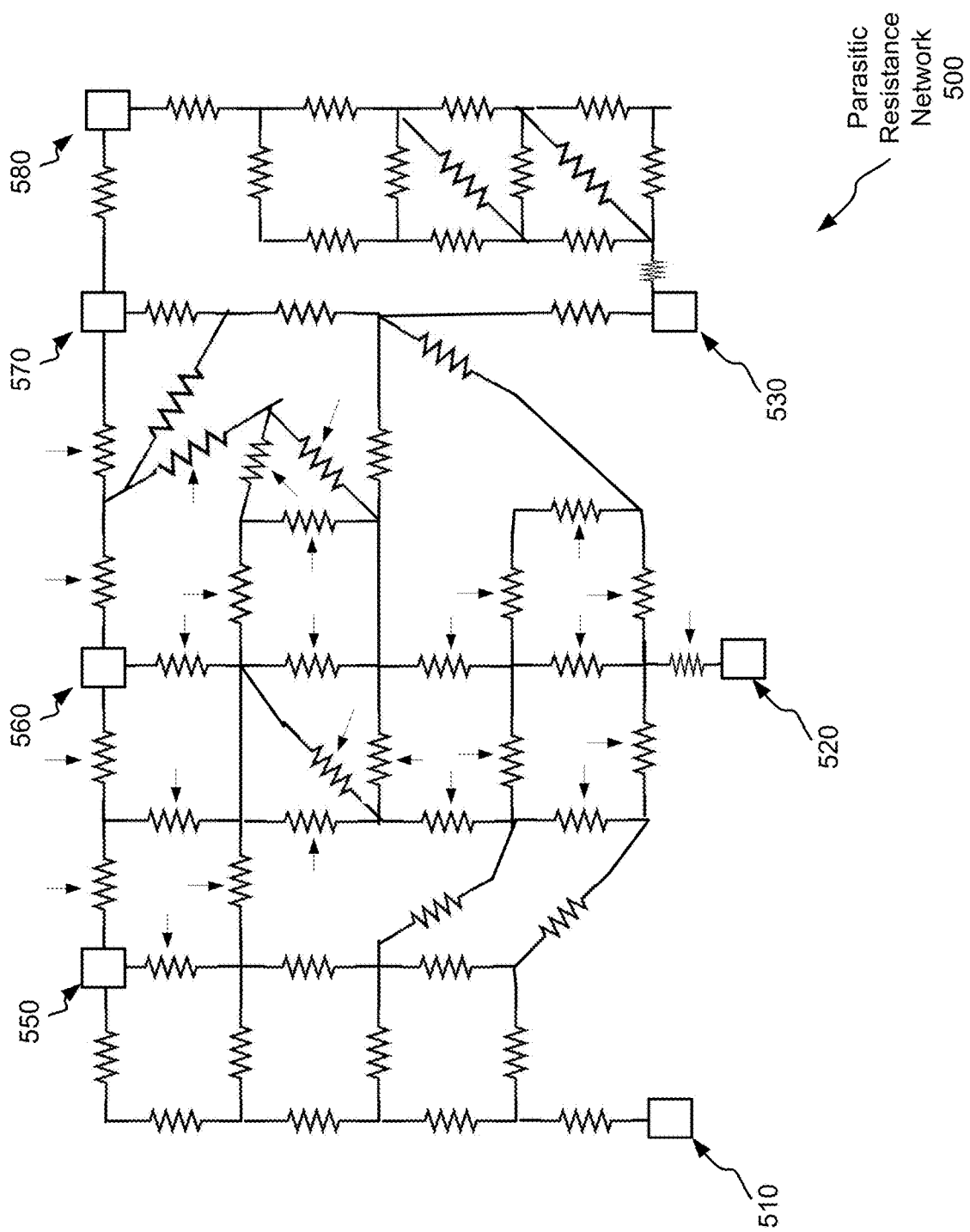
FIG. 5 illustrates an example of a parasitic resistance network. In the figure, current carrying parasitic resistors are indicated by straight line arrows.

FIG. 5 illustrates an example of a parasitic resistance network 500. In the parasitic resistance network 500, there are nine nodes 510-590. The node 520 may be chosen as the current source node while the rest of the nodes 510 and 530-590 may be chosen as the current drain nodes. After a current is injected at the node 520, simulation is performed for the parasitic resistance network 500 and current values may be obtained for each of the parasitic resistors. With some implementations of the disclosed technology, only parasitic resistance networks that have a large number of parasitic resistors are chosen as the one or more parasitic resistance networks for the resistor network reduction.

In operation 420, the resistance network reduction unit 320 determine one or more reduced parasitic resistance network for the one or more parasitic resistance networks by removing non-current carrying parasitic resistors from the one or more parasitic resistance networks. The non-current carrying parasitic resistors are determined based on the current data and a predetermined threshold current value. An example of the predetermined threshold current value is on the order of $10^{-5}$ Ampere. If the current flowing through a parasitic resistor is less than $2\times10^{-5}$ Ampere, for example, this parasitic resistor will be treated as a non-current carrying parasitic resistor and will be removed from the parasitic resistance network being considered. In FIG. 5, current carrying parasitic resistors are indicated by straight line arrows.

In operation 430, the full-circuit simulation unit 330 performs full-circuit simulation using the one or more reduced parasitic resistance networks to determine current density information. The one or more reduced parasitic resistance networks can make the full-chip simulation more practical and/or faster. The full-circuit simulation unit 330 can be implemented by various simulation tools such as those produced by Mentor Graphics Corporation, Wilsonville, Oreg.

In operation 440, the design analysis unit 340 performs circuit design verification of the circuit design based on the current density information. The circuit design verification may comprise ESD (electrostatic discharge) protection checks, electromigration checks, or both. The circuit design may be modified based on the results of the circuit design verification.

In operation 450, the circuit design verification tool 300 reports results of the circuit design verification. The reporting may comprise storing and/or displaying results of the circuit design verification. If the circuit design verification includes ESD protection checks. The circuit design verification tool 300 (or the graph unit 360) may annotate the graphical representation of the circuit design with indications of ESD protection problems, for example, which can identify a location of the ESD protection problems, the corresponding rule prompting the ESD protection problems, or the like. In some embodiments, the graph display unit 360 may display the annotated graphical representation of the circuit design on a display device.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. One or more non-transitory computer-readable media storing computer-executable instructions, the computer-executable instructions which, when executed by one or more processors, cause the one or more processors to perform a method, the method comprising:

performing a simulation to determine current data of parasitic resistors in one or more parasitic resistance networks in power supply circuitry of a circuit design by injecting a current into each one of the one or more parasitic resistance networks, the current being injected at one or more current source nodes and being drained at one or more current drain nodes, the one or more current source nodes and the one or more current drain nodes being selected from nodes of the power supply circuitry that are connected to said each one of the one or more parasitic resistance networks, the nodes of the power supply circuitry comprising pins of circuit devices in or connected to the power supply circuitry, power supply pads (power/ground), or both;

determining one or more reduced parasitic resistance networks for the one or more parasitic resistance networks by removing non-current carrying parasitic resistors from the one or more parasitic resistance networks, wherein the non-current carrying parasitic resistors are determined based on the current data and a predetermined threshold current value;

performing a full-circuit simulation using the one or more reduced parasitic resistance networks to obtain current density information;

performing a circuit design verification of the circuit design based on the current density information; and reporting results of the circuit design verification.

2. The one or more non-transitory computer-readable media recited in claim 1, wherein the circuit devices in the power supply circuitry comprise a voltage divider, an ESD (electrostatic discharge) protection device, or both.

3. The one or more non-transitory computer-readable media recited in claim 1, wherein the circuit design verification comprises ESD (electrostatic discharge) protection checks, electromigration checks, or both.

4. The one or more non-transitory computer-readable media recited in claim 1, wherein the injected current is between two and five times of an amount of current which the power supply circuitry is designed for.

5. The one or more non-transitory computer-readable media recited in claim 1, wherein the predetermined threshold current value is on the order of $10^{-5}$ Ampere.

6. A method executed by at least one processor of a computer, the method comprising:

performing a simulation to determine current data of parasitic resistors in one or more parasitic resistance networks in power supply circuitry of a circuit design by injecting a current into each one of the one or more parasitic resistance networks, the current being injected at one or more current source nodes and being drained at one or more current drain nodes, the one or more current source nodes and the one or more current drain nodes being selected from nodes of the power supply circuitry that are connected to said each one of the one or more parasitic resistance networks, the nodes of the power supply circuitry comprising pins of circuit devices in or connected to the power supply circuitry, power supply pads (power/ground), or both;

determining one or more reduced parasitic resistance networks for the one or more parasitic resistance networks by removing non-current carrying parasitic resistors from the one or more parasitic resistance networks, wherein the non-current carrying parasitic resistors are determined based on the current data and a predetermined threshold current value;

performing a full-circuit simulation using the one or more reduced parasitic resistance networks to obtain current density information;

performing a circuit design verification of the circuit design based on the current density information; and reporting results of the circuit design verification.

7. The method recited in claim 6, wherein the circuit devices in the power supply circuitry comprise a voltage divider, an ESD (electrostatic discharge) protection device, or both.

8. The method recited in claim 6, wherein the circuit design verification comprises ESD (electrostatic discharge) protection checks, electromigration checks, or both.

9. The method recited in claim 6, wherein the injected current is between two and five times of an amount of current which the power supply circuitry is designed for.

10. The method recited in claim 6, wherein the predetermined threshold current value is on the order of $10^{-5}$ Ampere.

11. A system comprising:

one or more processors, the one or more processors programmed to perform a method, the method comprising:

performing a simulation to determine current data of parasitic resistors in one or more parasitic resistance networks in power supply circuitry of a circuit design by injecting a current into each one of the one or more parasitic resistance networks, the current being injected at one or more current source nodes and being drained at one or more current drain nodes, the one or more current source nodes and the one or more current drain nodes being selected from nodes of the power supply circuitry that are connected to said each one of the one or more parasitic resistance networks, the nodes of the power supply circuitry comprising pins of circuit devices in or connected to the power supply circuitry, power supply pads (power/ground), or both;

determining one or more reduced parasitic resistance networks for the one or more parasitic resistance networks by removing non-current carrying parasitic resistors from the one or more parasitic resistance networks, wherein the non-current carrying parasitic resistors are determined based on the current data and a predetermined threshold current value;

performing a full-circuit simulation using the one or more reduced parasitic resistance networks to obtain current density information;

performing a circuit design verification of the circuit design based on the current density information; and reporting results of the circuit design verification.

12. The system recited in claim 11, wherein the circuit devices in the power supply circuitry comprise a voltage divider, an ESD (electrostatic discharge) protection device, or both.

13. The system recited in claim 11, wherein the circuit design verification comprises ESD (electrostatic discharge) protection checks, electromigration checks, or both.

14. The system recited in claim 11, wherein the injected current is between two and five times of an amount of current which the power supply circuitry is designed for.

15. The system recited in claim 11, wherein the predetermined threshold current value is on the order of $10^{-5}$ Ampere.

* * * * *